United States Patent

Ariga et al.

[11] Patent Number: 5,973,283
[45] Date of Patent: Oct. 26, 1999

[54] TEARABLE MEMBRANE SWITCH WITH RESINOUS BOUNDED SILVER-PALLADIUM ALLOY CONTACTS

[75] Inventors: Katsuhiko Ariga, Obu; Masayasu Teraoka, Chiryu; Yoshimitsu Motoki, Kaminiikawa-gun; Tetsushi Yokoe, Nei-gun; Ichirou Ishiyama, Takaoka, all of Japan

[73] Assignees: Denso Corporation, Kariya; Hokuriku Electric Industry Co., Ltd., Kami-niikawagun, both of Japan

[21] Appl. No.: 09/084,403

[22] Filed: May 27, 1998

[30] Foreign Application Priority Data

Jun. 17, 1997 [JP] Japan ................................ 9-177702

[51] Int. Cl.⁶ .............................. H01H 1/02; H01H 9/00; H01H 13/70
[52] U.S. Cl. ...................... 200/512; 200/61.54; 200/266; 200/268; 200/269
[58] Field of Search ................................. 200/5 A, 61.54, 200/512–517, 262–270; 75/228, 245–248; 252/514; 420/501, 505

[56] References Cited

U.S. PATENT DOCUMENTS

| | | | |
|---|---|---|---|
| 4,138,604 | 2/1979 | Harmsen et al. | 200/267 |
| 4,143,253 | 3/1979 | Wagner et al. | 200/268 X |
| 4,574,014 | 3/1986 | Stockel et al. | 200/266 X |
| 5,198,629 | 3/1993 | Hayashi et al. | 200/61.54 |
| 5,438,175 | 8/1995 | Herklotz et al. | 200/269 |
| 5,458,702 | 10/1995 | Ono et al. | 75/247 X |
| 5,605,560 | 2/1997 | Ono et al. | 75/334 |
| 5,653,918 | 8/1997 | Towlson | 252/514 |
| 5,856,641 | 1/1999 | Schreiber et al. | 200/512 X |

FOREIGN PATENT DOCUMENTS

| | | | |
|---|---|---|---|
| 2-12125 | 5/1990 | Japan | H01H 13/08 |
| 7-254308 | 10/1995 | Japan | H01H 1/06 |

*Primary Examiner*—J. R. Scott
*Attorney, Agent, or Firm*—Pillsbury Madison & Sutro LLP

[57] ABSTRACT

A membrane switch having a pair of flexible printed boards and a pair of contacts respectively disposed on said printed boards. The contacts are formed of powdered alloy of silver and palladium bounded by resinous material, and a conductive layer of silver powder is disposed between the flexible printed board and the contact. Preferably, the powdered alloy contains 50–97 weight percent silver and palladium in the remainder of weight percent.

14 Claims, 3 Drawing Sheets

TEARABLE MEMBRANE SWITCH WITH RESINOUS BOUNDED SILVER-PALLADIUM ALLOY CONTACTS

CROSS REFERENCE TO RELATED APPLICATION

The present application is based on and claims priority from Japanese Patent Application Hei 9-177702, filed on Jun. 17, 1997, the contents of which are incorporated herein by reference.

BACKGROUND OF THE INVENTION

1. Field of the Invention

The present invention relates to a tearable membrane switch, particularly, a membrane switch for use with an air bag mounted in the steering wheel of a vehicle.

2. Description of the Related Art

A membrane switch for a vehicle has usually a pair of contacts made of copper. Therefore, the surfaces of the contacts are apt to be covered by oxide film or hydroxide film, thereby gradually increasing the contact resistance of the membrane switch. Generally, such a contact is formed from a copper film bonded to a base film sheet, and it may become thick and stiff. A membrane switch employing such contacts may not be suitable for a horn switch for a vehicle which is equipped with an air bag system because the horn switch that is installed in the steering wheel must tear when an air bag accommodated in the steering wheel is inflated. However, the above contacts may be too stiff to tear for the air bag to be inflated in a short time.

If the material of the contacts is changed to mixture of silver powder and carbon powder, the contact resistance necessarily increases to a level not suitable for the horn switch.

SUMMARY OF THE INVENTION

A main object of the present invention is to provide contact material of a membrane switch which can be used for the horn switch and can tear with sure when the air bag system is inflated.

Another object is to provide a membrane switch which is composed of a pair of flexible printed boards and a pair of contacts respectively disposed on the printed boards, in which each of the contacts has powdered alloy of silver and palladium bounded by resinous material. The membrane switch may have a conductive layer of silver powder disposed between the flexible printed board and the contact. In the membrane switch, the powdered alloy preferably contains 50–97 weight percent silver.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

DETAILED DESCRIPTION OF THE PREFERRED EMBODIMENTS

A membrane switch according to a preferred embodiment of the present invention is described with reference to the appended drawings.

Figure 1:
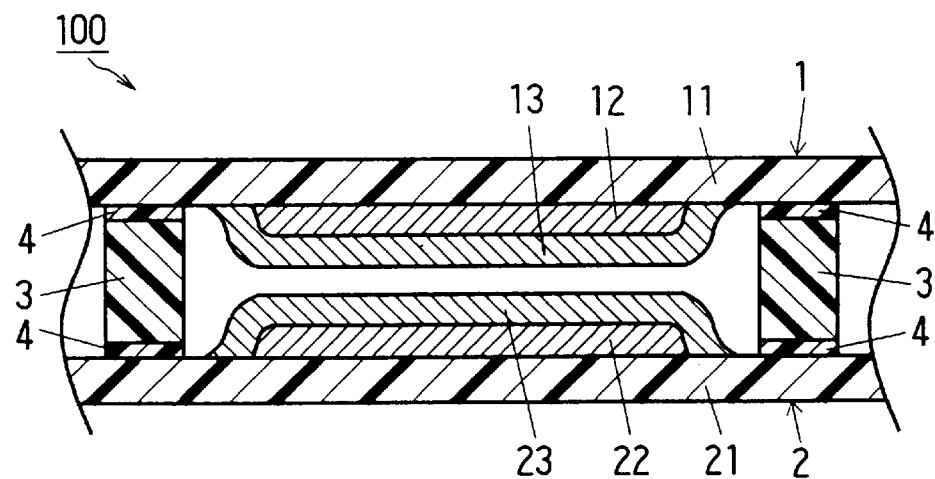
FIG. 1 is a schematic cross-sectional view illustrating a membrane switch according to a preferred embodiment of the present invention.

Membrane switch 100 is composed of upper and lower flexible printed circuits 1, 2, a plurality of insulating spacers 3 disposed between flexible printed circuit 1, 2 and bonded thereto by adhesive 4 at equal intervals, leads 112 and terminal portion 150 having output terminals 113. When flexible printed circuit 1 is pressed from above in FIG. 1, it bends downward between spacers 3 to bring contacts 13, 23 into contact with each other.

Upper flexible printed circuit 1 is composed of base film sheet 11, conductive layer 12 and contact 13. Lower flexible printed circuit 2 is also composed of base film sheet 21, conductive layer 22 and contact 23. Base film sheets 11, 21 are made of polyethylene terephthalate (PET), and conductive layers 12, 22 are made of mixture of silver powder and binding resin such as polyester, polyether or polycarbonate. Each of contacts 13, 23 includes powdered alloy of 50–97 weight percent of silver and the remaining weight percent of palladium. The powdered alloy is bounded by a binder and printed on conductive sheet 12 to be as thick as 15–20 $\mu$m. The weight percent of powdered alloy 12, 23 to whole contacts 13, 23 including the binder is between 91% and 95%. The binder for the powdered alloy of contacts 13, 23 is resin such as polyester, polyether or polycarbonate and printed on conductive layer 12. After being printed, the contacts are heated at temperature higher than 100° C. The powdered alloy is made by a coprecipitation of silver powder and palladium powder. The particle diameter of the powdered alloy is 0.5–5.0 $\mu$m. The powdered alloy can be substituted by coating of solid-solution, intermetallic compound, an alloy made by slope ratio method or metal layers of different compositions.

Figure 2:
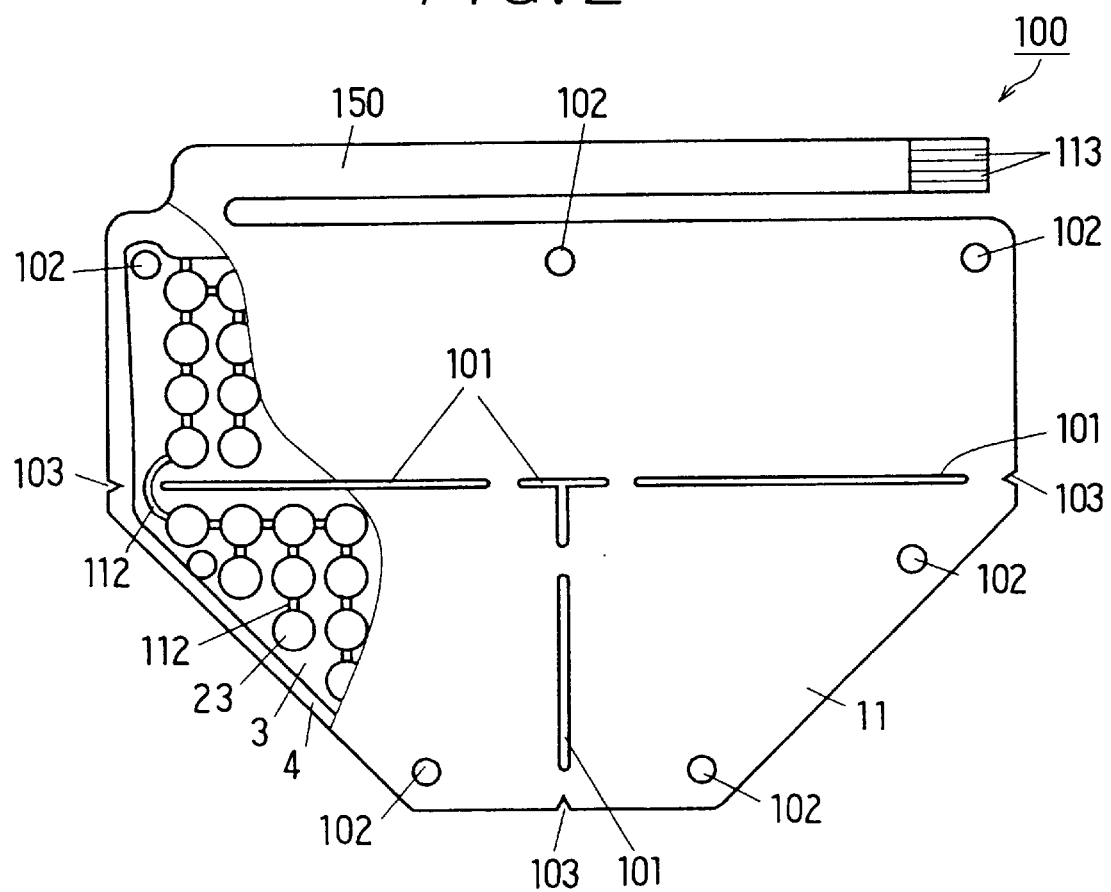
FIG. 2 is a schematic plan view illustrating the membrane switch shown in FIG. 1.
Figure 3:
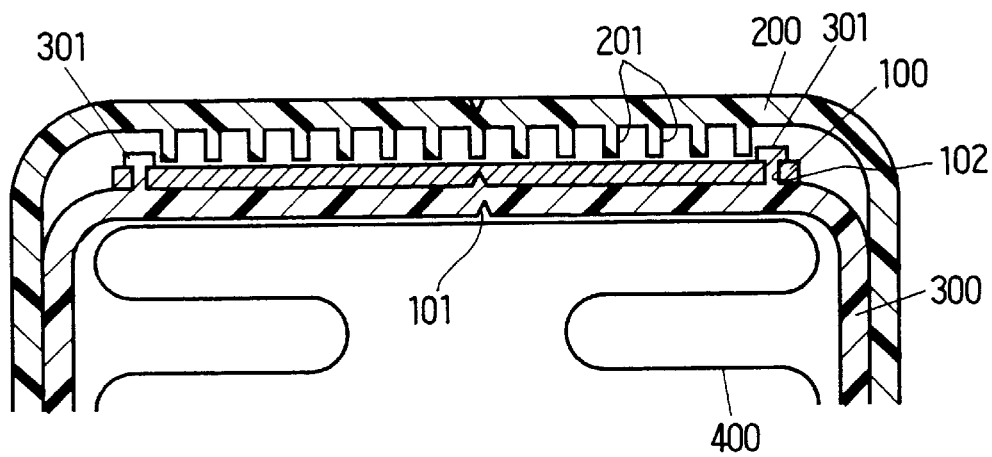
FIG. 3 is a schematic side view illustrating the membrane switch shown in FIG. 1 installed in a steering pad.

As shown in FIGS. 2 and 3, base film sheet 11 has a plurality of grooves 101, notches 103 and a plurality of fixing holes 102 for fixing membrane switch 100 between steering pad 200 and under-plate 300 of an air bag module which accommodates air bag 400 therein. Grooves 101 and notches 103 form tear line and are arranged to cut off along the tear line when the air bag is inflated. Fixing holes 102 are rivetted by a plurality of projections 301 extending from under-plate 300. Steering pad 200 has a plurality of pushing members 201 on the inner periphery thereof. When steering pad 200 is pressed down from above, pushing members 201 press down contacts 13 to come into contact with contacts 23, thereby supplying electric current to the horn.

Figure 4:
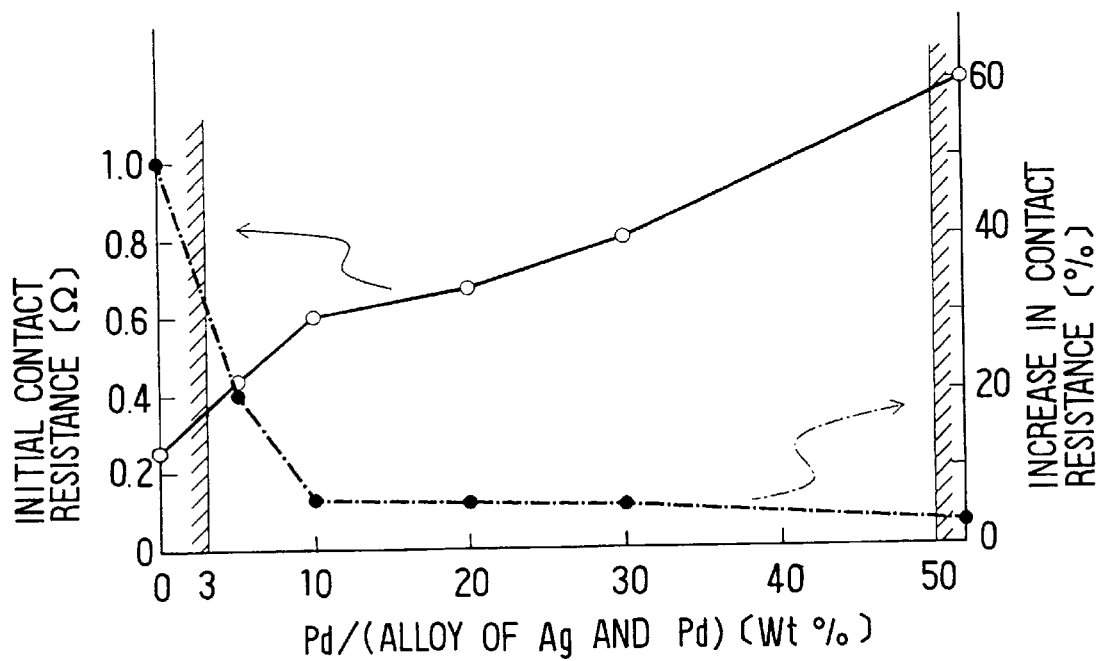
FIG. 4 is a graph showing relationship between weight percentages of palladium in the powdered alloy of the contact for the membrane switch and contact resistances of the contact.

As shown in FIG. 4, a test result shows that the contact resistance of a new contact decreases sharply with increased weight percent of silver of the powdered alloy from zero to 10. On the other hand the contact resistance of aged contacts after 100,000 switching operations increases gradually with increased weight percentage of silver. The test was conducted with samples having contacts closed at pressure of 50 grams, through which test current of 300 mA is supplied.

According to the test result, the weight percentage of silver should be between 50% and 97%, more preferably, between 50% and 90%. If the weight percentage of silver becomes higher than 97%, palladium is not effective to prevent silver from being oxidized or sulfurized. On the other hand, if the weight percentage of silver becomes lower than 50%, the initial contact resistance becomes too high for the horn switch.

Figure 5:
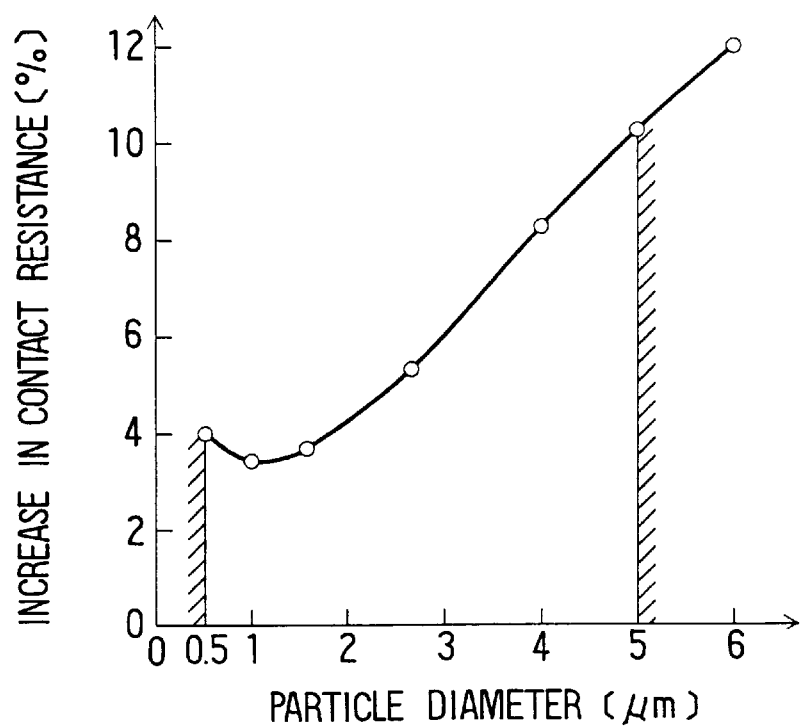
FIG. 5 is a graph showing relationship between the particle diameters of the powdered alloy and contact resistances of the contact.

As shown in FIG. 5, another test result shows that the contact resistance of the aged contacts is low and preferable if the particle diameter is between 0.5 µm and about 5.0 µm, more preferably 0.5 µm and 2.5 µm. The sample contacts in this test include 80 weight percent silver (Ag/(Ag+Pd)=80 percent in weight) and 92 weight percent powdered alloy (powdered alloy/(powdered alloy+binder)=92 percent in weight).

If the particle diameter of the powdered alloy is larger than 5.0 µm, the distance between the alloy particles increases. This causes the contacts to be oxidized and increases the contact resistance.

Figure 6:
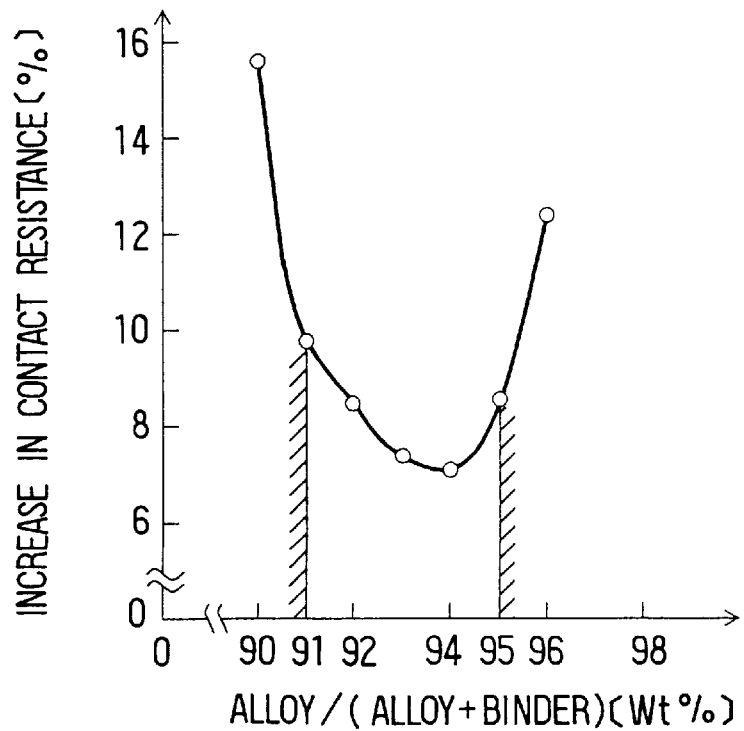
FIG. 6 is a graph showing relationship between weight percentage of the powdered alloy of the contact and the contact resistances of the contact.

As shown in FIG. 6, another test result shows that preferable weight percent of the powdered alloy to the contact material, which includes powdered alloy and the binder, is between 91% and 95%. More preferably, the weight percent of the powdered alloy is between 93% and 94%.

If the weight percentage of the powdered alloy to the contact material is higher than 95%, the binding force between particles of the powdered alloy decreases, thereby causing the fretting corrosion. On the other hand, if the weight percentage of the powdered alloy is less than 91%, the initial contact resistance becomes higher than the level suitable for the horn switch.

(Variations)

Conductive layers 12, 22 can be omitted according to circumstances. Grooves 101 can be formed opposite side of base film sheets 11, 21. Contact 13, 23 can be formed by spraying powdered alloy mixed with binder on base film sheets 11, 21.

In the foregoing description of the present invention, the invention has been disclosed with reference to specific embodiments thereof. It will, however, be evident that various modifications and changes may be made to the specific embodiments of the present invention without departing from the broader spirit and scope of the invention as set forth in the appended claims. Accordingly, the description of the present invention in this document is to be regarded in an illustrative, rather than restrictive, sense.

What is claimed is:

1. A membrane switch comprising a pair of flexible printed boards and a pair of contacts respectively disposed on said printed boards, wherein
   each of said contacts comprises powdered alloy of silver and palladium bounded by resinous material.

2. A membrane switch as claimed in claim 1, further comprising a pair of conductive layers of silver powder each of which is disposed between one of said flexible printed boards and one of said contacts.

3. A membrane switch as claimed in claim 1, wherein said powdered alloy contains 50–97 weight percent silver.

4. A membrane switch as claimed in claim 1, wherein said powdered alloy contains 50–90 weight percent silver.

5. A membrane switch as claimed in claim 1, wherein each of said contacts contains 91–95 weight percent powdered alloy.

6. A membrane switch as claimed in claim 1, wherein each of said contacts contains 93–94 weight percent powdered alloy.

7. A membrane switch as claimed in claim 1, wherein particle diameter of said powdered alloy is between 0.5 µm and 5.0 µm.

8. A membrane switch as claimed in claim 1, wherein particle diameter of said powdered alloy is between 0.5 µm and 2.5 µm.

9. A membrane switch as claimed in claim 1, wherein each of said contacts comprises a printed layer of powdered alloy.

10. A membrane switch as claimed in claim 1, wherein one of said flexible printed board comprises a base film sheet having a tear line composed of a plurality of grooves and notches.

11. A membrane switch as claimed in claim 5, wherein said powdered alloy contains 50–97 weight percent silver.

12. A membrane switch as claimed in claim 5, wherein said powdered alloy contains 50–90 weight percent silver.

13. A membrane switch as claimed in claim 5, wherein particle diameter of said powdered alloy is between 0.5 µm and 5.0 µm.

14. A membrane switch as claimed in claim 5, wherein particle diameter of said powdered alloy is between 0.5 µm and 2.5 µm.

* * * * *